United States Patent
Feygin et al.

(10) Patent No.: US 9,425,758 B2
(45) Date of Patent: Aug. 23, 2016

(54) WIRELESS COMMUNICATION SYSTEM WITH POWER AMPLIFIER MECHANISM AND METHOD OF OPERATION THEREOF

(71) Applicant: Samsung Electronics Co., Ltd., Gyeonggi-Do (KR)

(72) Inventors: Gennady Feygin, San Diego, CA (US); Inyup Kang, San Diego, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 25 days.

(21) Appl. No.: 14/025,514

(22) Filed: Sep. 12, 2013

(65) Prior Publication Data

US 2014/0077876 A1    Mar. 20, 2014

Related U.S. Application Data

(60) Provisional application No. 61/702,200, filed on Sep. 17, 2012.

(51) Int. Cl.
| | |
|---|---|
| *H03G 3/00* | (2006.01) |
| *H03F 3/00* | (2006.01) |
| *H03F 1/02* | (2006.01) |
| *H04B 1/04* | (2006.01) |

(52) U.S. Cl.
CPC ............ *H03G 3/004* (2013.01); *H03F 1/0277* (2013.01); *H03F 3/005* (2013.01); *H03F 2201/3215* (2013.01); *H04B 2001/0408* (2013.01)

(58) Field of Classification Search
CPC . H03F 3/005; H03F 3/20; H04B 2001/0408; H04B 2001/0416
USPC ......... 455/127.1, 127.2, 127.5, 102; 330/295
See application file for complete search history.

(56) References Cited

U.S. PATENT DOCUMENTS

| | | | |
|---|---|---|---|
| 6,952,144 B2* | 10/2005 | Javor | ............................... 333/32 |
| 8,299,855 B2 | 10/2012 | Shi et al. | |
| 8,344,923 B1 | 1/2013 | Cripe | |
| 8,373,504 B2 | 2/2013 | Haroun et al. | |
| 8,547,177 B1* | 10/2013 | Yoo et al. | ...................... 330/295 |
| 2006/0267683 A1 | 11/2006 | Liu et al. | |
| 2007/0014382 A1 | 1/2007 | Shakeshaft et al. | |
| 2011/0133966 A1* | 6/2011 | Ono | ................... H03M 1/0607 341/118 |
| 2012/0092075 A1 | 4/2012 | Young et al. | |
| 2012/0146722 A1* | 6/2012 | Scott et al. | ................... 330/192 |
| 2012/0146731 A1 | 6/2012 | Khesbak | |
| 2012/0161994 A1* | 6/2012 | Quiquempoix et al. | ...... 341/143 |
| 2012/0182069 A1 | 7/2012 | Stanley | |
| 2012/0242395 A1 | 9/2012 | Ding | |
| 2012/0280841 A1* | 11/2012 | Wang | .................. H03M 1/1295 341/110 |
| 2015/0171768 A1* | 6/2015 | Perreault | ............... H02M 7/537 330/251 |

OTHER PUBLICATIONS

Yoo et al., "A Switched-Capacitor Power Amplifier for EER/Polar Transmitters," IEEE Intl, Solid-State Circuits Conference Digest of Technical Papers (ISSCC) 2011, Feb. 20-24, 2011, pp. 428-430.

(Continued)

*Primary Examiner* — Nguyen Vo

(74) *Attorney, Agent, or Firm* — IP Investment Law Group

(57) ABSTRACT

A wireless communication system includes: a switching capacitor; a multi-way switch, having at least a first voltage input port, a second voltage input port, and an intermediate voltage input port, coupled to the switching capacitor; and a CORDIC processor, coupled to the multi-way switch, configured to select the first voltage input port, the second voltage input port, or the intermediate voltage input port.

20 Claims, 10 Drawing Sheets

(56) References Cited

OTHER PUBLICATIONS

International Search Report for PCT Application No. PCT/KR2013/008441 dated Dec. 23, 2013.

Hadong Jin, et al., "Efficient Digital Quadrature Transmitter Based on IQ Cell Sharing", ISSCC 2015 / Feb. 24, 2015 / Session 9 / High Performance Wireless 19.5, 2015 IEEE International Solid-State Circuits Conference, pp. 168 to 170; copyright 2015 IEEE.

* cited by examiner

WIRELESS COMMUNICATION SYSTEM WITH POWER AMPLIFIER MECHANISM AND METHOD OF OPERATION THEREOF

CROSS-REFERENCE TO RELATED APPLICATION(S)

This application claims the benefit of U.S. Provisional Patent Application Ser. No. 61/702,200 filed Sep. 17, 2012, and the subject matter thereof is incorporated herein by reference thereto.

TECHNICAL FIELD

An embodiment of the present invention relates generally to a wireless communication system, and more particularly to a system for managing a power amplifier in a wireless communication system.

BACKGROUND

Demand for wireless devices is growing rapidly worldwide, with increasing number of wireless devices in operation and rapidly growing bandwidth per device. Consumers demand devices that combine light weight with long battery life. This combination puts a premium on energy efficiency of the electronic devices. Manufacturers are driven to reduce manufacturing costs of the devices, which can generally be accomplished through higher integration.

Radio frequency integrated circuits (RFIC) devices combine most of the functionality of the transceiver except the power amplifier (PA). High efficiency PA's are typically implemented in more exotic semiconductor technologies, such as Gallium Arsenide (GaAs), Gallium Nitride (GaN), or Silicon Germanium (SiGe), that cannot be integrated on the same wafer as the rest of the RFIC. Complementary Metal Oxide Semiconductor (CMOS) PA's are not readily available, because implementations are typically less efficient and are restricted to low cost segment of the market due to their limited range. Since PA's are a dominant power consumer in a mobile device, reducing power consumption is critical. This is becoming increasingly important as data rates are growing and multiple PA's can be operating simultaneously within a wireless device.

Thus, a need still remains for a wireless communication system with power amplifier mechanism for synthesis of a carrier frequency. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides a wireless communication system including: a switching capacitor; a multi-way switch, having at least a first voltage input port, a second voltage input port, and an intermediate voltage input port, coupled to the switching capacitor; and a CORDIC processor, coupled to the multi-way switch, configured to select the first voltage input port, the second voltage input port, or the intermediate voltage input port.

An embodiment of the present invention provides a wireless communication system, including: a switching capacitor configured as a positive switching capacitor; a multi-way switch, having at least a first voltage input port, a second voltage input port, and an intermediate voltage input port, coupled to the switching capacitor includes a shared intermediate voltage switch coupled to the positive switching capacitor; a negative switching capacitor coupled to the shared intermediate voltage switch; and a CORDIC processor, coupled to the multi-way switch, configured to select the first voltage input port, the second voltage input port, or the intermediate voltage input port Includes a virtual intermediate voltage coupled between the positive switching capacitor and the negative switching capacitor through the shared intermediate voltage switch.

An embodiment of the present invention provides a method of operation of a wireless communication system including: conditioning a switching capacitor by an intermediate voltage input from a multi-way switch; generating an amplitude output including controlling the multi-way switch; and selecting a first voltage input, a second voltage input, or an intermediate voltage input on the multi-way switch for reducing a power loss of the switching capacitor.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
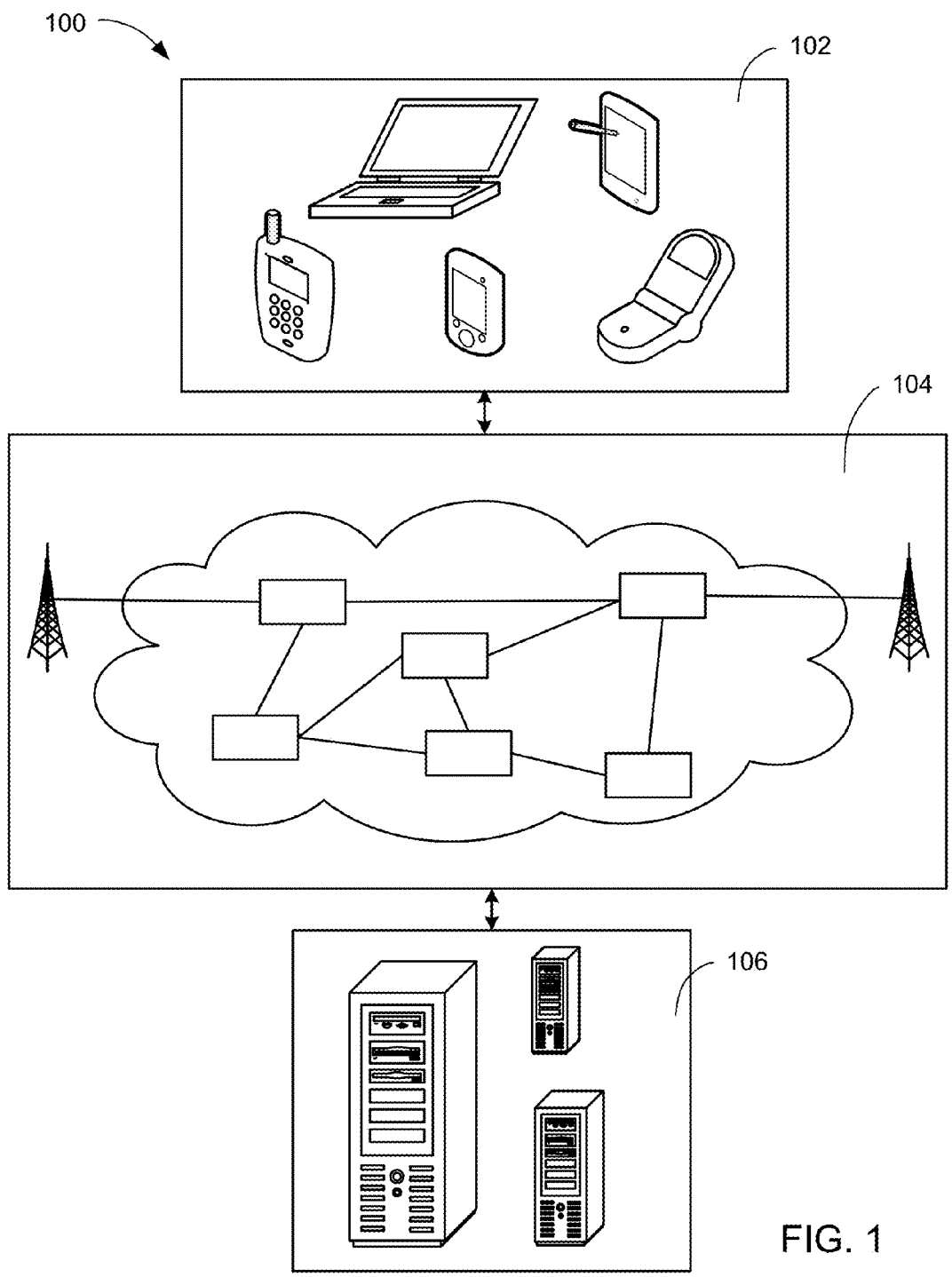
FIG. 1 is a wireless communication system in an embodiment of the present invention.

An embodiment of the present invention provides a power amplifier with reduced switched-capacitor power losses that is capable of integration into a radio frequency integrated circuit utilizing complementary metal oxide semiconductor (CMOS) circuitry. The unit capacitor can reduce the power loss due to capacitor switching to one fourth of what was possible with previous switched-capacitor power amplifiers.

The application of the shared intermediate voltage switch can perform a pre-charge and a pre-discharge at the same time while recovering the energy that would otherwise have to be wasted. The delivery of the virtual intermediate voltage through the shared intermediate voltage switch is a reciprocating process between the positive switching capacitor and the negative switching capacitor that does not require implementation of the power supply for the intermediate voltage.

An embodiment of the present invention provides a power amplifier with the intermediate voltage can be established at half of the first voltage in order to reduce the power lost during transition of the switching capacitor. The intermediate voltage can be set to half of the first voltage, which puts it in the middle between the first voltage and the second voltage. The intermediate voltage can be conceptualized as being sourced from a virtual capacitor. The virtual capacitor can conserve some of the charge that would normally be dissipated as heat by transitioning the switching capacitor directly between the first voltage and the second voltage. The recovery of the charge from a unit capacitor that is being discharged can be transferred to another unit capacitor that is being charged without requiring a power supply to generate the recovered charge. The switched-capacitor power loss can be reduced to one fourth of what is possible in prior art switched-capacitor power amplifiers.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation. The embodiments have been numbered first embodiment, second embodiment, etc. as a matter of descriptive convenience and are not intended to have any other significance or provide limitations for an embodiment of the present invention.

The term "module" referred to herein can include software, hardware, or a combination thereof in an embodiment of the present invention in accordance with the context in which the term is used. For example, the software can be machine code, firmware, embedded code, and application software. Also for example, the hardware can be circuitry, processor, computer, integrated circuit, integrated circuit cores, a pressure sensor, an inertial sensor, a microelectromechanical system (MEMS), passive devices, or a combination thereof.

Referring now to FIG. 1, therein is shown a wireless communication system 100 with power amplifier mechanism in an embodiment of the present invention. The wireless communication system 100 includes a wireless device 102, such as a client or a server, connected to a wired device 106, such as a client or server. The wireless device 102 can communicate with the wired device 106 with a communication path 104, such as a wireless or wired network.

For example, the wireless device 102 can be of any of a variety of devices, such as a cellular phone, personal digital assistant, a notebook computer, or entertainment device. The wireless device 102 can couple, either directly or indirectly, to the communication path 104 to communicate with the wired device 106 or can be a stand-alone device.

For illustrative purposes, the wireless communication system 100 is described with the wireless device 102 as a communication device, although it is understood that the wireless device 102 can be different types of devices. As an example, the wireless device 102 can be a personal digital assistant, a cellular phone, or a multi-media set.

The wired device 106 can be any of a variety of centralized or decentralized computing devices. For example, the wired device 106 can be a multimedia computer, a laptop computer, a desktop computer, grid-computing resources, a virtualized computer resource, cloud computing resource, a wireless base station, peer-to-peer distributed computing devices, or a combination thereof.

The wired device 106 can be centralized in a single room, distributed across different rooms, distributed across different geographical locations, embedded within a telecommunications network. The wired device 106 can couple with the communication path 104 to communicate with the wireless device 102.

For illustrative purposes, the wireless communication system 100 is described with the wired device 106 as a computing device, although it is understood that the wired device 106 can be different types of devices. Also for illustrative purposes, the wireless communication system 100 is shown with the wired device 106 and the wireless device 102 as end points of the communication path 104, although it is understood that the wireless communication system 100 can have a different partition between the wireless device 102, the wired device 106, and the communication path 104. For example, the wireless device 102, the wired device 106, or a combination thereof can also function as part of the communication path 104.

The communication path 104 can span and represent a variety of networks. For example, the communication path 104 can include wireless communication, wired communication, optical, ultrasonic, or the combination thereof. Satellite communication, cellular communication, Bluetooth, Infrared Data Association standard (IrDA), wireless fidelity (WiFi), and worldwide interoperability for microwave access (WiMAX) are examples of wireless communication that can be included in the communication path 104. Ethernet, digital subscriber line (DSL), fiber to the home (FTTH), and plain old telephone service (POTS) are examples of wired communication that can be included in the communication path 104. Further, the communication path 104 can traverse a number of network topologies and distances. For example, the communication path 104 can include direct connection, personal area network (PAN), local area network (LAN), metropolitan area network (MAN), wide area network (WAN), or a combination thereof.

Figure 2:
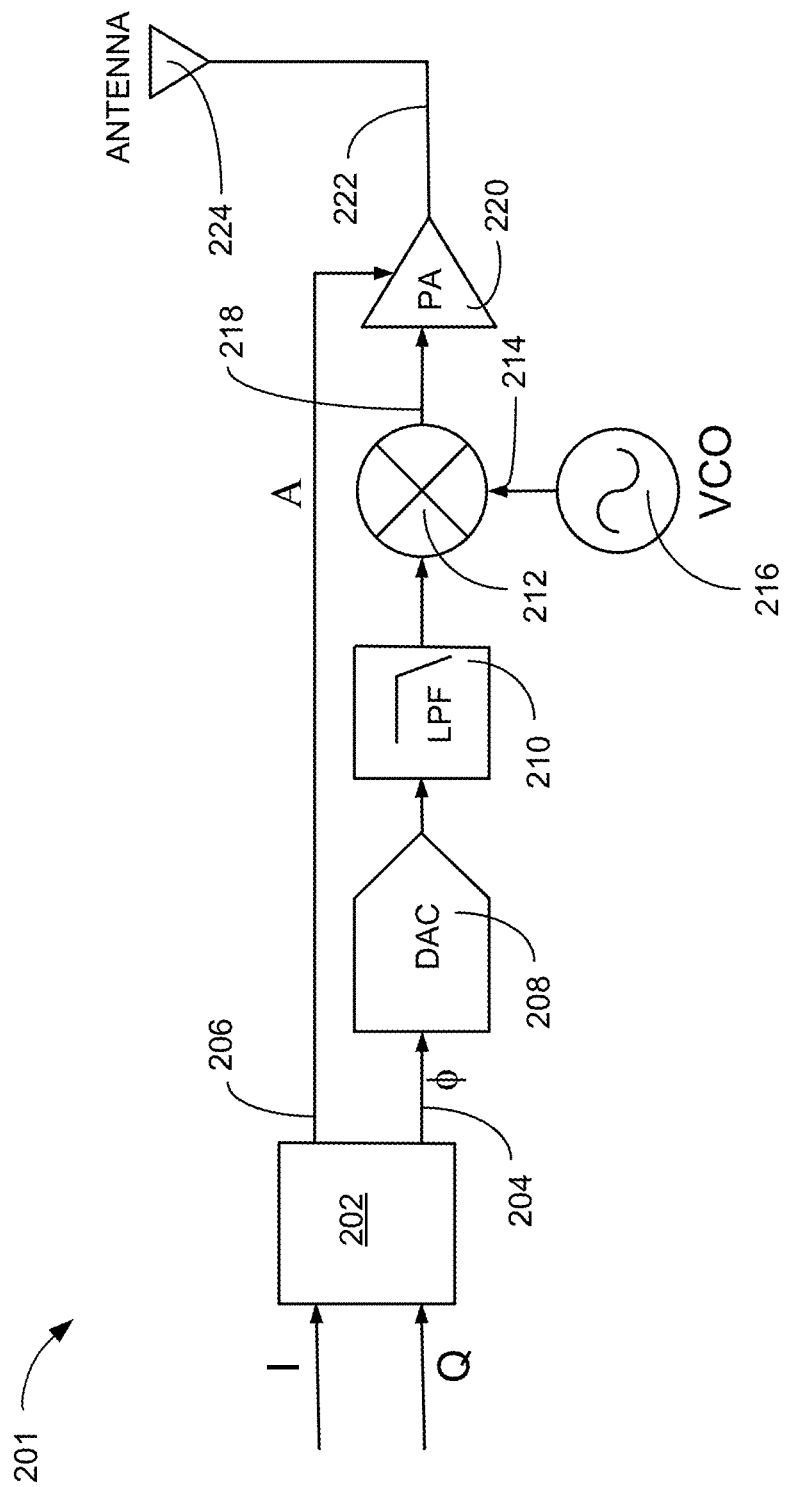
FIG. 2 is a schematic diagram of a transmitter of the wireless device of FIG. 1.

Referring now to FIG. 2, therein is shown a schematic diagram of a transmitter 201 of the wireless device 102 of FIG. 1. The schematic diagram of the transmitter 201 depicts a CORDIC processor 202 having a phase output 204 and an amplitude output 206. The CORDIC processor 202 can be a numerical processor that is specifically formatted for geometrical computations and high speed mathematical computations.

The phase output 204 can be coupled to a digital-to-analog converter (DAC) 208 for producing a sinusoidal signal carrying phase modulation corresponding to the phase output 204. The output of the DAC 208 can be coupled to a low-pass filter 210 in order to block any high frequency aliasing passing through the phase output 204. The low-pass filter 210 can be coupled to a mixer 212 in order to modulate a clock 214 from a voltage controlled oscillator 216, which generates the phase-modulated carrier frequency for the transmitter 201.

The mixer 212 couples the coded data 218 to a power amplifier 220, such as a switched-capacitor power amplifier. The amplitude output 206 of the CORDIC processor 202 can be coupled to the power amplifier 220 in order to control the signal strength of a transmit data 222 that is coupled to an antenna 224 for transmitting the transmit data 222 through the communication path 104 of FIG. 1.

Figure 3:
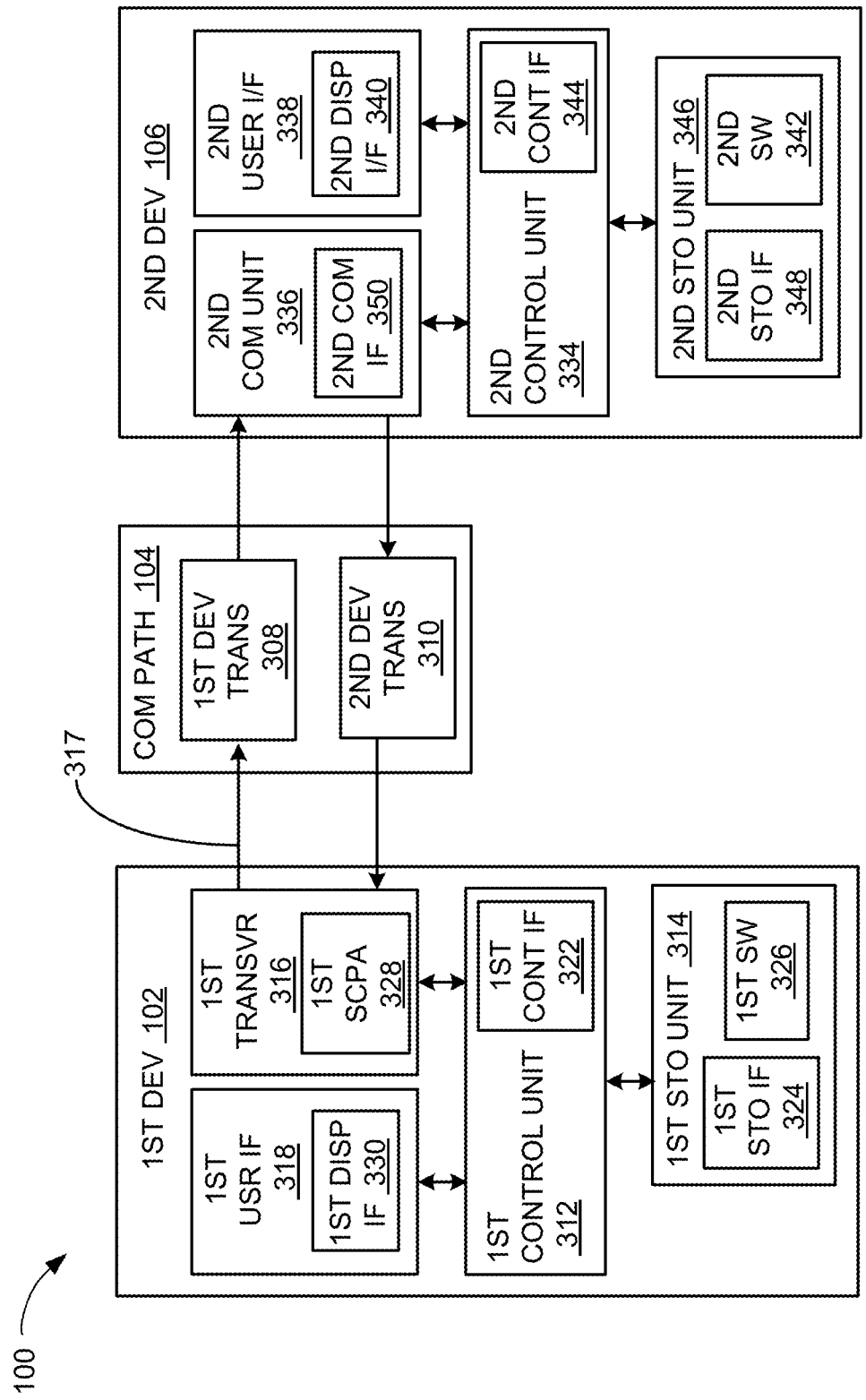
FIG. 3 is an exemplary block diagram of the wireless communication system.

Referring now to FIG. 3, therein is shown an exemplary block diagram of the wireless communication system 100. The wireless communication system 100 can include the wireless device 102, the communication path 104, and the wired device 106. The wireless device 102 can send information in a first device transmission 308 over the communication path 104 to the wired device 106. The wired device 106 can send information in a second device transmission 310 over the communication path 104 to the wireless device 102.

For illustrative purposes, the wireless communication system 100 is shown with the wireless device 102 as a client device, although it is understood that the wireless communication system 100 can have the wireless device 102 as a different type of device. For example, the wireless device 102 can be a server having a display interface.

Also for illustrative purposes, the wireless communication system 100 is shown with the wired device 106 as a server, although it is understood that the wireless communication system 100 can have the wired device 106 as a different type of device. For example, the wired device 106 can be a client device.

For brevity of description in this embodiment of the present invention, the wireless device 102 will be described as a client device and the wired device 106 will be described as a server device. The embodiment of the present invention is not limited to this selection for the type of devices. The selection is an example of an embodiment of the present invention.

The wireless device 102 can include a first control unit 312, a first storage unit 314, a first transceiver 316 for transmitting an output power 317, and a first user interface 318. The first control unit 312 can include a first control interface 322. The first control unit 312 can execute a first software 326 to provide the intelligence of the wireless communication system 100.

The first control unit 312 can be implemented in a number of different manners. For example, the first control unit 312 can be a processor, an application specific integrated circuit (ASIC) an embedded processor, a microprocessor, a hardware control logic, a hardware finite state machine (FSM), a digital signal processor (DSP), or a combination thereof. The first control interface 322 can be used for communication between the first control unit 312 and other functional units in the wireless device 102. The first control interface 322 can also be used for communication that is external to the wireless device 102.

The first control interface 322 can receive information from the other functional units or from external sources, or can transmit information to the other functional units or to external destinations. The external sources and the external destinations refer to sources and destinations external to the wireless device 102.

The first control interface 322 can be implemented in different ways and can include different implementations depending on which functional units or external units are being interfaced with the first control interface 322. For example, the first control interface 322 can be implemented with a pressure sensor, an inertial sensor, a microelectromechanical system (MEMS), optical circuitry, waveguides, wireless circuitry, wireline circuitry, or a combination thereof.

The first storage unit 314 can store the first software 326. The first storage unit 314 can also store the relevant information, such as data representing incoming messages, data representing previously presented messages, sound files, or a combination thereof.

The first storage unit 314 can be a volatile memory, a nonvolatile memory, an internal memory, an external memory, or a combination thereof. For example, the first storage unit 314 can be a nonvolatile storage such as non-volatile random access memory (NVRAM), Flash memory, disk storage, or a volatile storage such as static random access memory (SRAM).

The first storage unit 314 can include a first storage interface 324. The first storage interface 324 can be used for communication between and other functional units in the wireless device 102. The first storage interface 324 can also be used for communication that is external to the wireless device 102.

The first storage interface 324 can receive information from the other functional units or from external sources, or can transmit information to the other functional units or to external destinations. The external sources and the external destinations refer to sources and destinations external to the wireless device 102.

The first storage interface 324 can include different implementations depending on which functional units or external units are being interfaced with the first storage unit 314. The first storage interface 324 can be implemented with technologies and techniques similar to the implementation of the first control interface 322.

The first transceiver 316 can enable external communication to and from the wireless device 102. For example, the first transceiver 316 can permit the wireless device 102 to communicate with the wired device 106 of FIG. 1, an attachment, such as a peripheral device or a computer desktop, and the communication path 104. The first transceiver 316 can be implemented as a radio frequency integrated circuit (RFIC) implemented in a complementary metal oxide semiconductor (CMOS) technology.

The first transceiver 316 can also function as a communication hub allowing the wireless device 102 to function as part of the communication path 104 and not limited to be an end point or terminal unit to the communication path 104. The first transceiver 316 can include active and passive components, such as microelectronics or an antenna, for interaction with the communication path 104.

The first transceiver 316 can include a power amplifier 220, such as a switched-capacitor power amplifier. The power amplifier 220 can be used for communication between the first transceiver 316 and other functional units in the communication path 104. The power amplifier 220 can provide the transmit data 222 to the other functional units in and beyond the communication path 104.

The power amplifier 220 can include different implementations depending on which functional units are being interfaced with the first transceiver 316. The power amplifier 220 can be implemented with technologies and techniques similar to the implementation of the first control interface 322.

The first user interface 318 allows a user (not shown) to interface and interact with the wireless device 102. The first user interface 318 can include an input device and an output device. Examples of the input device of the first user interface 318 can include a keypad, a touchpad, soft-keys, a keyboard, a microphone, an infrared sensor for receiving remote signals, or any combination thereof to provide data and communication inputs.

The first user interface 318 can include a first display interface 330. The first display interface 330 can include a display, a projector, a video screen, a speaker, or any combination thereof.

The first control unit 312 can operate the first user interface 318 to display information generated by the wireless communication system 100. The first control unit 312 can also execute the first software 326 for the other functions of the wireless communication system 100. The first control unit 312 can further execute the first software 326 for interaction with the communication path 104 via the first transceiver 316.

The wired device 106 can be optimized for implementing an embodiment of the present invention in a multiple device embodiment with the wireless device 102. The wired device 106 can provide the additional or higher performance processing power compared to the wireless device 102. The wired device 106 can include a second control unit 334, a second communication unit 336, and a second user interface 338.

The second user interface 338 allows a user (not shown) to interface and interact with the wired device 106. The second user interface 338 can include an input device and an output device. Examples of the input device of the second user interface 338 can include a keypad, a touchpad, soft-keys, a keyboard, a microphone, or any combination thereof to provide data and communication inputs. Examples of the output device of the second user interface 338 can include a second display interface 340. The second display interface 340 can include a display, a projector, a video screen, a speaker, or any combination thereof.

The second control unit 334 can execute a second software 342 to provide the intelligence of the wired device 106 of the wireless communication system 100. The second software 342 can operate in conjunction with the first software 326. The second control unit 334 can provide additional performance compared to the first control unit 312.

The second control unit 334 can operate the second user interface 338 to display information. The second control unit 334 can also execute the second software 342 for the other functions of the wireless communication system 100, including operating the second communication unit 336 to communicate with the wireless device 102 over the communication path 104.

The second control unit 334 can be implemented in a number of different manners. For example, the second control unit 334 can be a processor, an embedded processor, a microprocessor, hardware control logic, a hardware finite state machine (FSM), a digital signal processor (DSP), or a combination thereof.

The second control unit 334 can include a second controller interface 344. The second controller interface 344 can be used for communication between the second control unit 334 and other functional units in the wired device 106. The second controller interface 344 can also be used for communication that is external to the wired device 106.

The second controller interface 344 can receive information from the other functional units or from external sources, or can transmit information to the other functional units or to external destinations. The external sources and the external destinations refer to sources and destinations external to the wired device 106.

The second controller interface 344 can be implemented in different ways and can include different implementations depending on which functional units or external units are being interfaced with the second controller interface 344. For example, the second controller interface 344 can be implemented with a pressure sensor, an inertial sensor, a microelectromechanical system (MEMS), optical circuitry, waveguides, wireless circuitry, wireline circuitry, or a combination thereof.

A second storage unit 346 can store the second software 342. The second storage unit 346 can also store the such as data representing incoming messages, data representing previously presented messages, sound files, or a combination thereof. The second storage unit 346 can be sized to provide the additional storage capacity to supplement the first storage unit 314.

For illustrative purposes, the second storage unit 346 is shown as a single element, although it is understood that the second storage unit 346 can be a distribution of storage elements. Also for illustrative purposes, the wireless communication system 100 is shown with the second storage unit 346 as a single hierarchy storage system, although it is understood that the wireless communication system 100 can have the second storage unit 346 in a different configuration. For example, the second storage unit 346 can be formed with different storage technologies forming a memory hierarchal system including different levels of caching, main memory, rotating media, or off-line storage.

The second storage unit 346 can be a volatile memory, a nonvolatile memory, an internal memory, an external memory, or a combination thereof. For example, the second storage unit 346 can be a nonvolatile storage such as non-volatile random access memory (NVRAM), Flash memory, disk storage, or a volatile storage such as static random access memory (SRAM).

The second storage unit 346 can include a second storage interface 348. The second storage interface 348 can be used for communication between other functional units in the wired device 106. The second storage interface 348 can also be used for communication that is external to the wired device 106.

The second storage interface 348 can receive information from the other functional units or from external sources, or can transmit information to the other functional units or to external destinations. The external sources and the external destinations refer to sources and destinations external to the wired device 106.

The second storage interface 348 can include different implementations depending on which functional units or external units are being interfaced with the second storage unit 346. The second storage interface 348 can be implemented with technologies and techniques similar to the implementation of the second controller interface 344.

The second communication unit 336 can enable external communication to and from the wired device 106. For example, the second communication unit 336 can permit the wired device 106 to communicate with the wireless device 102 over the communication path 104.

The second communication unit 336 can also function as a communication hub allowing the wired device 106 to function as part of the communication path 104 and not limited to be an end point or terminal unit to the communication path 104. The second communication unit 336 can include active and passive components, such as microelectronics or an antenna, for interaction with the communication path 104.

The second communication unit 336 can include a second communication interface 350. The second communication interface 350 can be used for communication between the second communication unit 336 and other functional units in the wired device 106. The second communication interface 350 can receive information from the other functional units or can transmit information to the other functional units.

The second communication interface 350 can include different implementations depending on which functional units are being interfaced with the second communication unit 336. The second communication interface 350 can be implemented with technologies and techniques similar to the implementation of the second controller interface 344.

The first transceiver 316 can couple with the communication path 104 to send information to the wired device 106 in the first device transmission 308. The wired device 106 can receive information in the second communication unit 336 from the first device transmission 308 of the communication path 104.

The second communication unit 336 can couple with the communication path 104 to send information to the wireless device 102 in the second device transmission 310. The wireless device 102 can receive information in the first transceiver 316 from the second device transmission 310 of the communication path 104. The wireless communication system 100 can be executed by the first control unit 312, the second control unit 334, or a combination thereof. For illustrative purposes, the wired device 106 is shown with the partition having the second user interface 338, the second storage unit 346, the second control unit 334, and the second communication unit 336, although it is understood that the wired device 106 can have a different partition. For example, the second software 342 can be partitioned differently such that some or all of its function can be in the second control unit 334 and the second communication unit 336. Also, the wired device 106 can include other functional units not shown in FIG. 3 for clarity.

The functional units in the wireless device 102 can work individually and independently of the other functional units. The wireless device 102 can work individually and independently from the wired device 106 and the communication path 104.

The functional units in the wired device 106 can work individually and independently of the other functional units. The wired device 106 can work individually and independently from the wireless device 102 and the communication path 104.

For illustrative purposes, the wireless communication system 100 is described by operation of the wireless device 102 and the wired device 106. It is understood that the wireless device 102 and the wired device 106 can operate any of the modules and functions of the wireless communication system 100.

Figure 4:
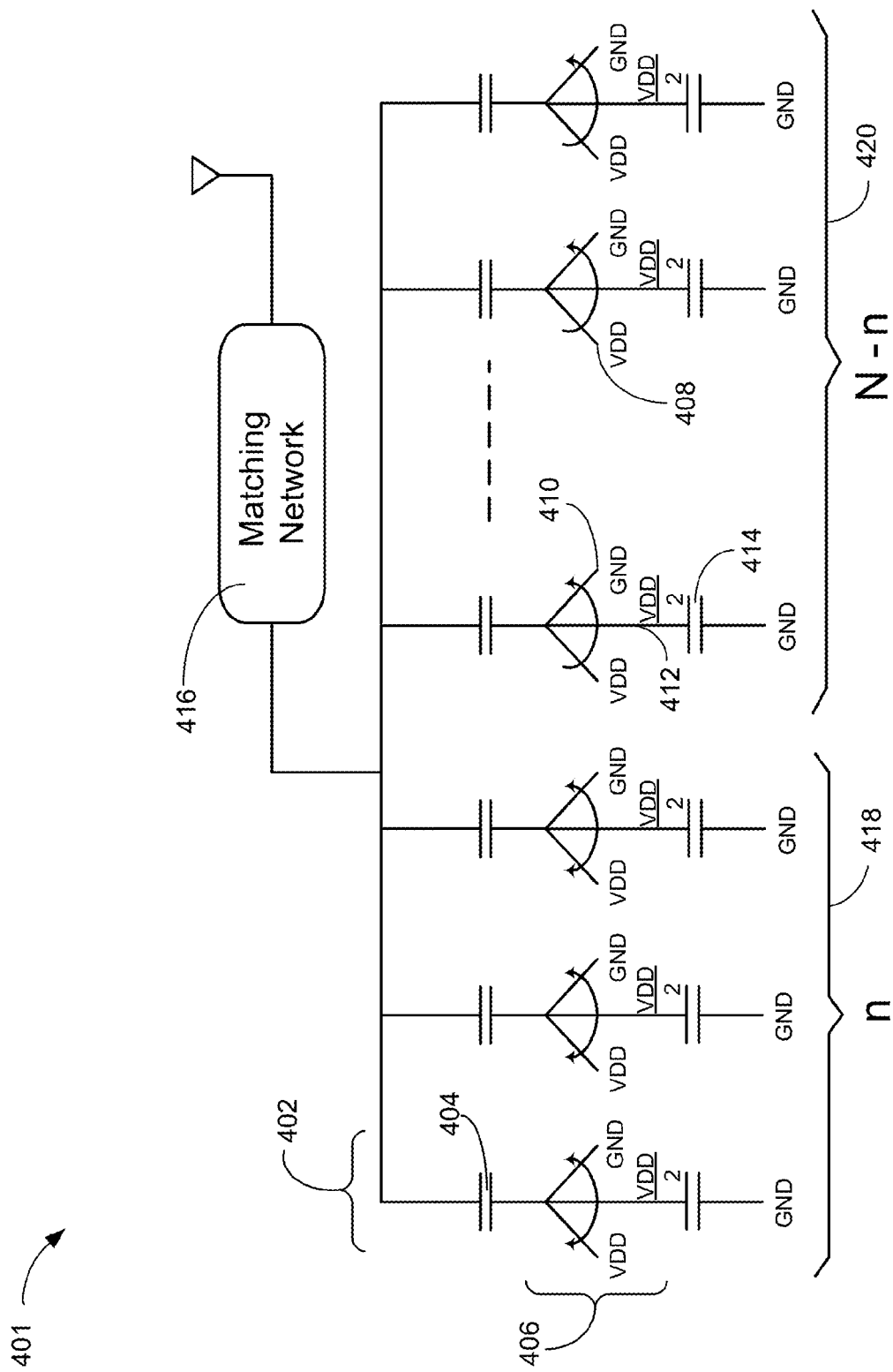
FIG. 4 is a schematic diagram of a switched capacitor array of the power amplifier of FIG. 2.

Referring now to FIG. 4, therein is shown a schematic diagram of a switched capacitor array 401 of the power amplifier 220 of FIG. 2. The schematic diagram of the switched capacitor array 401 depicts a unit capacitor 402, having a switching capacitor 404 coupled to a multi-way switch 406. The switched capacitor array 401 can be formed of N of the unit capacitor 402, where N is an integer greater than 2.

The multi-way switch 406, having a minimum of three input ports, can be formed of a series of metal oxide semiconductor field effect transistors (MOSFETs) not shown, or other switches, including MEMS. The multi-way switch 406 can be controlled by the CORDIC processor 202 of FIG. 2 to selectively couple a first voltage 408, such as a positive $V_{DD}$ voltage, a second voltage 410, such as a ground reference GND, and an intermediate voltage 412, such as a positive voltage between the positive $V_{DD}$ voltage and the ground reference GND.

It has been discovered that the intermediate voltage 412 can be established at half of the first voltage 408 in order to reduce the power lost during transition of the switching capacitor 404. The intermediate voltage 412 can be set to half of the first voltage 408, which puts it in the middle between the first voltage 408 and the second voltage 410. The intermediate voltage 412 can be conceptualized as being sourced from a virtual capacitor 414. The virtual capacitor 414 can recover some of the charge that would normally be dissipated as heat by transitioning the switching capacitor 404 directly between the first voltage 408 and the second voltage 410. The recovery of the charge by the virtual capacitor 414 can improve power efficiency, which can translate to longer battery life in the wireless device 102 of FIG. 1.

On an "upstroke", can be understood to be the charging of the switching capacitor 404 from the second voltage 410 to the first voltage 408, by briefly configuring the multi-way switch 406 to couple the intermediate voltage 412 the switching capacitor 404 will be pre-charged to the intermediate voltage 412, such as $V_{DD}/2$. The charge necessary to perform the pre-charge for the upstroke will be restored when the switching capacitor 404 executes a "down stroke".

The down stroke is defined to be the discharge of the switching capacitor 404 from the first voltage 408 to the second voltage 410, by briefly configuring the multi-way switch 406 to couple the intermediate voltage 412 the switching capacitor 404 will be pre-discharged to the intermediate voltage 412, such as $V_{DD}/2$. The charge that was previously provided during the upstroke is returned to the virtual capacitor 414 during the down stroke. The symmetrical slopes of the charge and discharge of the switching capacitor 404 conserves the charge moved out of and into the virtual capacitor 414 on alternate upstroke and down stroke of the switching capacitor 404. It is important to note that switches are controlled by digital logic that combines phase modulation carried by the coded data 218 of FIG. 2, such as a phase modulated carrier with amplitude control derived from the amplitude output 206, which determines how many capacitors will be involved in switching action. When n out of N capacitors are chosen, output voltage will be proportional to $n/N*A_{max}$, where $A_{max}$ is the maximum voltage amplitude that may be developed.

A matching network 416 can allow combining N of the unit capacitor 402. At any instance in time a partial set (n) 418 of the multi-way switch 406 can be transitioned on for activating the partial set (n) 418 of the unit capacitor 402 for example, while the remaining set (N−n) 420 can be unchanged.

By way of an example the dynamic switching power of the switched capacitor array 401, having the only one of the intermediate voltage 412 set to $V_{DD}/2$, can be calculated by:

$$\tilde{P}_{SC} = (n(N-n))C\left(\frac{V_{DD}}{2}\right)^2 f \qquad (1)$$

Where $\tilde{P}_{SC}$ is the dynamic power dissipation of the switched capacitor array 401, n is the partial set (n) 418 of the unit capacitor 402 switched up to the first voltage 408 ($V_{DD}$), (N−n) is the remaining set (N−n) 420 of the unit capacitor 402 switched down to the second voltage 410 (GND), C is the capacitance value of the unit capacitor 402 being switched, and f is a switching frequency of the switched capacitor array 401.

Figure 5:
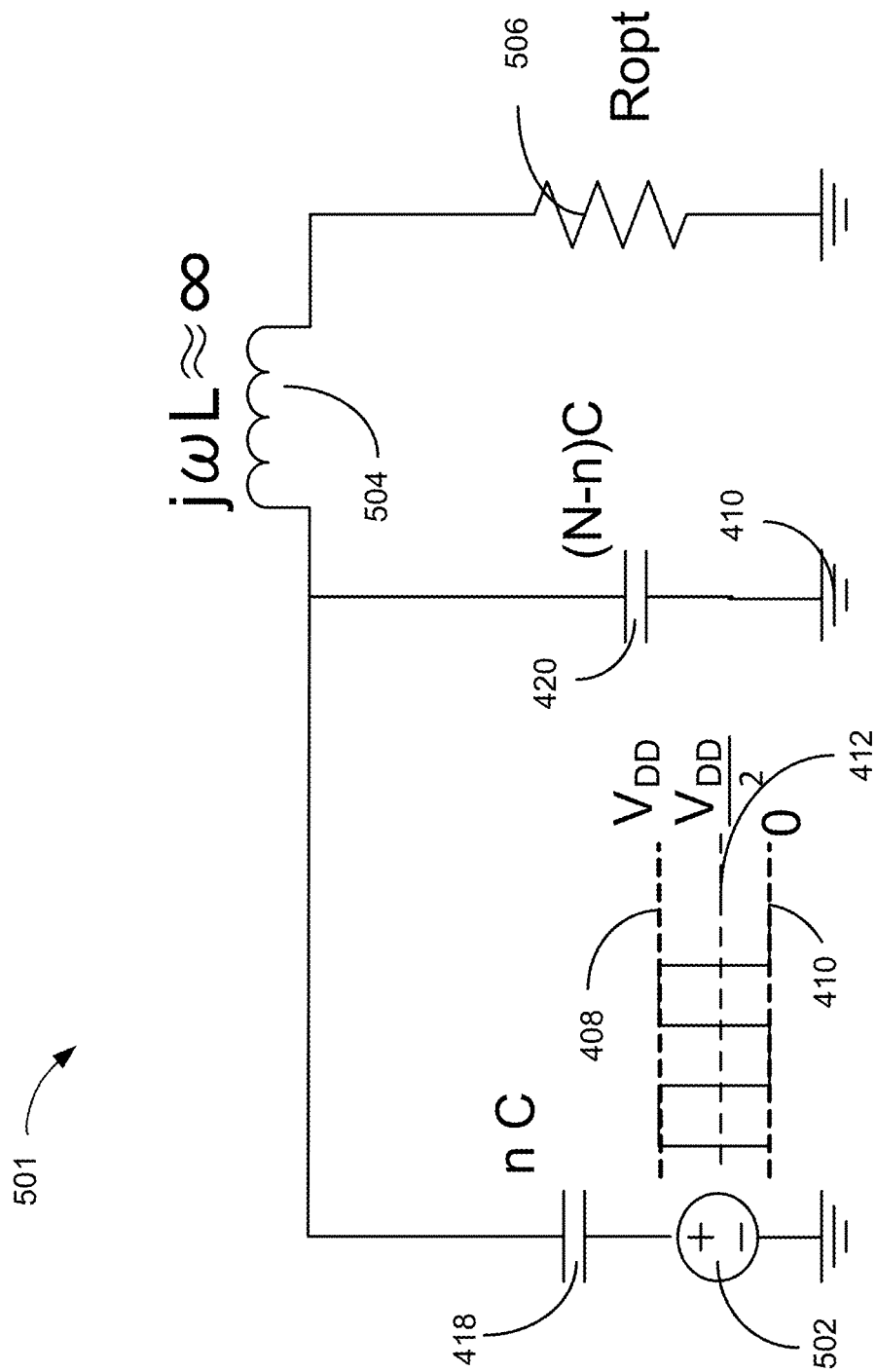
FIG. 5 is a schematic diagram of a Thevenin equivalent circuit of the switched capacitor array of FIG. 4.

Referring now to FIG. 5, therein is shown a schematic diagram of a Thevenin equivalent circuit 501 of the switched capacitor array 401 of FIG. 4. The schematic diagram of the Thevenin equivalent circuit 501 depicts a variable power supply 502 coupled to the partial set (n) 418 of the unit capacitor 402 of FIG. 4, which is shown as a single capacitor.

The partial set (n) 418 can be coupled to the remaining set (N−n) 420 of the unit capacitor 402 and an inductor 504, which represents the matching circuit 416 of FIG. 4. Other, more sophisticated implementations of the matching circuit 416 can be employed. For the purposes of analysis, output of the inductor 504 can be considered as coupled to a termination resistor 506, which represents the termination impedance of the antenna 224 of FIG. 2. The variable power supply 502, remaining set (N−n) 420 of the unit capacitor 402, and the termination resistor 506 can all be coupled to the second voltage 410 (GND).

During the sharp upstroke and down stroke transitions, the inductor 504 acts as an open circuit and all the dynamic power is consumed in charging/discharging the partial set (n) 418 of the unit capacitor 402 while the remaining set (N−n) 420 of the unit capacitor 402 remains unchanged. The act of charging/discharging can be paused for a finite amount of time at the intermediate voltage 412 by appropriate timing control of the switches. The transition of the partial set (n) 418 from the intermediate voltage 412 to the first voltage 408 or the second voltage 410 can consume one-fourth of the power required to switch directly between the first voltage 408 and the second voltage 410. A strategy of power recovery can improve a power average efficiency (PAE) by 50-60% over a digital power amplifier and by 12-30% over a switched-capacitor power amplifier that does not use the intermediate voltage 412 to improve the switching dynamic power. The power average efficiency (PAE) can be calculated by:

$$PAE_{ideal} = \frac{P_{out}}{P_{out} + P_{sc}} \qquad (2)$$

Where the $P_{SC}$ can be provided by equation 1 above and the $\tilde{P}_{out}$ can be approximated by:

$$\tilde{P}_{out} = 2\left(\frac{n}{\pi N}\right)^2 \frac{V_{DD}^2}{2R_{opt}} \qquad (3)$$

In the wireless communication system 100 of FIG. 1 charging of the unit capacitor 402 of FIG. 4 occurs in two steps (0→VDD/2 and VDD/2→VDD). Only the charge from main power supply (VDD/2→VDD transition) needs to be counted as contributing to dynamic power dissipation.

As will be shown, the energy for the transition from the second voltage 410 to the intermediate voltage 412 can be provided from one of the unit capacitor 402 that is being discharged. The recovery of the energy through the source of the intermediate voltage 412 can provide the energy required to transition from the second voltage 410 to the intermediate voltage 412 (0→VDD/2).

It is understood that the two step transition just described is an example only and is limited to the discussion of a single level of the intermediate voltage 412. The wireless communication system 100 can be implemented with more than a single level of the intermediate voltage 412. The number of steps required for a transition from the first voltage to the second voltage will require a number of steps that is one more than the number of levels of the intermediate voltage 412. By way of an example an embodiment utilizing two levels of the intermediate voltage 412 would transition between the first voltage 408 and the second voltage 410 in three steps. Any number of the levels of the intermediate voltage 412 can be implemented.

Figure 6:
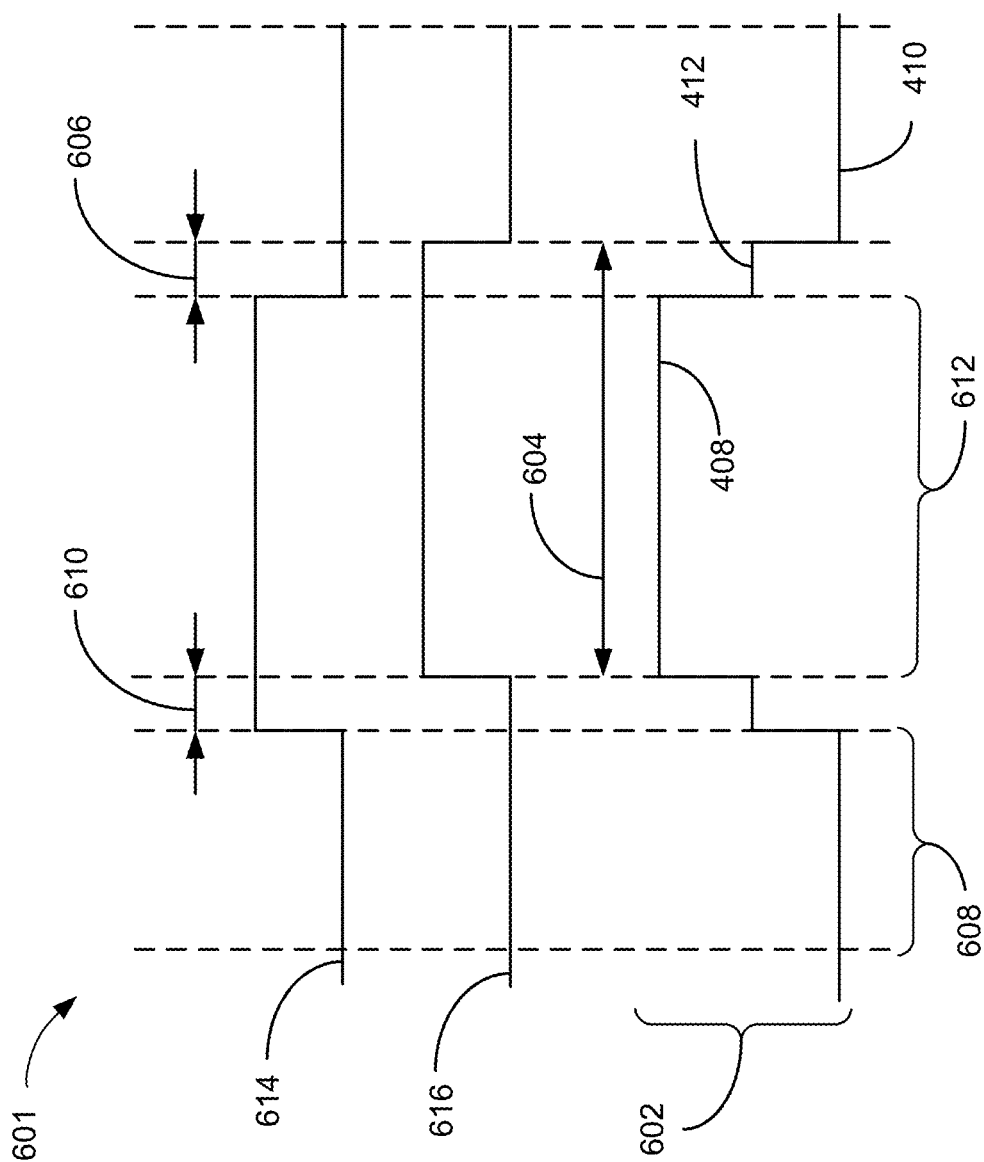
FIG. 6 is an exemplary timing diagram, of the power amplifier of FIG. 2, for optimizing an output.

Referring now to FIG. 6, therein is shown an exemplary timing diagram 601, of the power amplifier 220 of FIG. 2, for optimizing an output 602. The exemplary timing diagram 601, of the power amplifier 220 depicts the output 602 having a peak level at the first voltage 408 for a duration of one half period (T/2) 604 less a trailing delta period (ΔT) 606.

The output 602 can have a first phase 608 at the second voltage 410, a second phase 610 at the intermediate voltage 412 that is the same duration as the leading delta period (ΔT), a third phase 612 representing the peak of the output 602, and a fourth phase 606, represented by the trailing delta period (ΔT) 606, at the intermediate voltage 412. The duration of the second phase 610 and the fourth phase 606 are of equal duration.

The second phase 610 and the fourth phase 606 provide the output 602 coupled to the intermediate voltage 412. The minimization of the duration of the second phase 610 and the fourth phase 606 can provide a maximum duration of the first phase 608 and the third phase 612.

The output 602 can be transmitted through the antenna 224 of FIG. 2 to develop the output power 317 of FIG. 3. The actual voltage waveform follows trajectory 602, for purpose of analysis it can be thought of as being partitioned into a leading waveform 614 and a trailing waveform 616.

It has been discovered that the combination of the leading waveform 614 and the trailing waveform 616 can develop the output power 317 to nearly the one half period (T/2) 604, while keeping the dynamic switching power ($\tilde{P}_{SC}$) at its reduced value of ¼ of the dynamic switching power of a prior art switched-capacitor power amplifier. In theory, the maximum value of the output power ($\tilde{P}_{out}$) 317 will be obtained when the second phase 610 and the fourth phase 606, which are connected to the intermediate voltage 412, approaches zero. The practical considerations, such as non-zero switch resistance, will provide the output power ($\tilde{P}_{out}$) 317, at 90% of the value provided by the prior art switched-capacitor power amplifier, with practical value of the second phase 610 and the fourth phase 606 set to 36° in current generation of semiconductor technology. Further reduction of duration of this phase in future technologies may be possible leading to further power savings.

Figure 7:
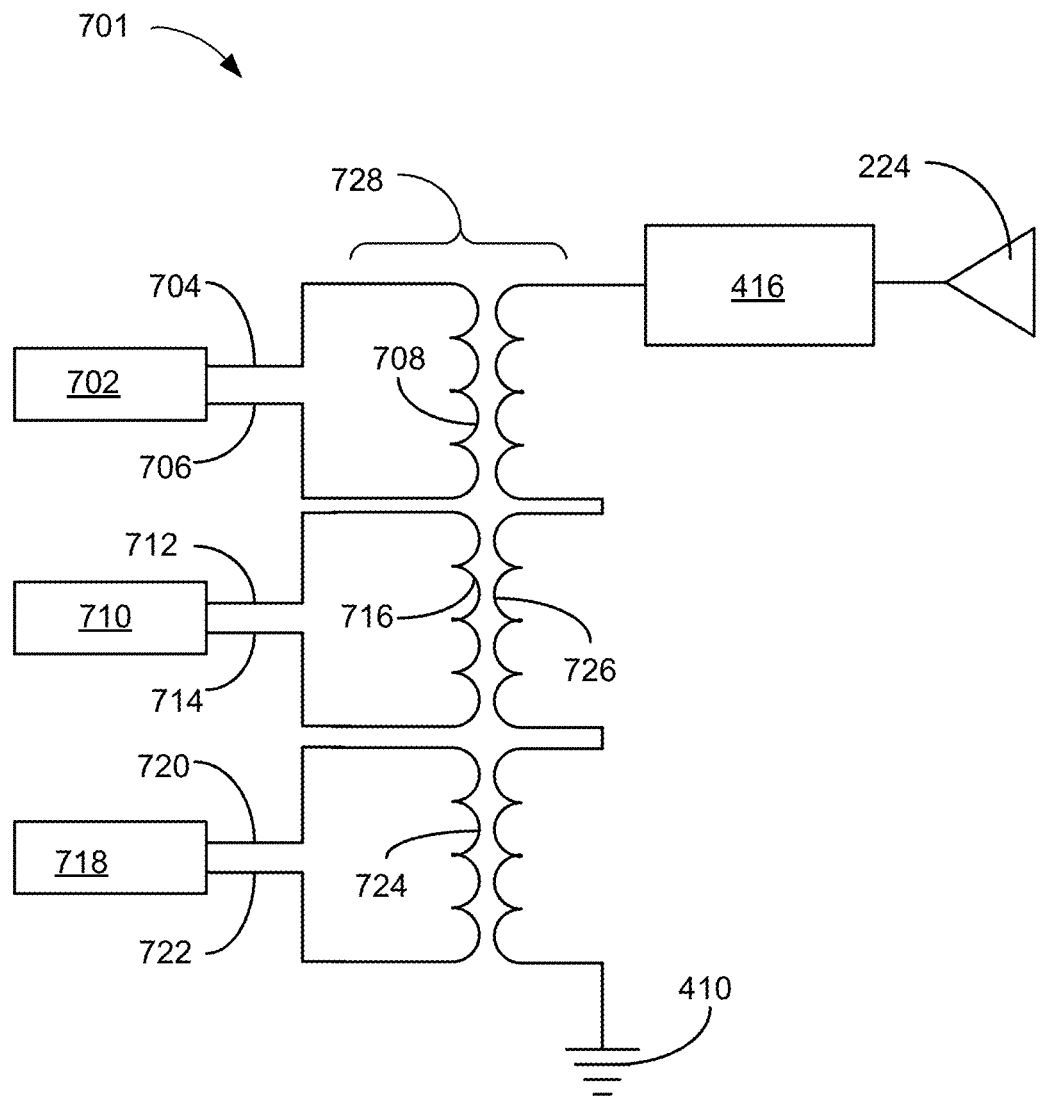
FIG. 7 is a schematic diagram of a differential-to-single-ended balun of the power amplifier of FIG. 2.

Referring now to FIG. 7, therein is shown a schematic diagram of a differential-to-single-ended balun 701 of the power amplifier 220 of FIG. 2. The schematic diagram of a differential-to-single-ended balun 701 depicts a first power amplifier 702 having a first positive differential output 704 and a first negative differential output 706. The first positive differential output 704 can be coupled through a first coupling inductor 708 to the first negative differential output 706.

A second power amplifier 710 having a second positive differential output 712 and a second negative differential output 714. The second positive differential output 712 can be coupled through a second coupling inductor 716 to the second negative differential output 714.

A third power amplifier 718 having a third positive differential output 720 and a third negative differential output 722. The third positive differential output 720 can be coupled through a third coupling inductor 724 to the third negative differential output 722.

A summing inductor 726 can be positioned to magnetically couple the first coupling inductor 708, the second coupling inductor 716, and the third coupling inductor 724. Each of the first power amplifier 702, the second power amplifier 710, and the third power amplifier 718 can provide the leading waveform 614 or the trailing waveform 616 that will be combined in the summing inductor 726 in a single-ended format. The summing inductor 726 can be electrically coupled to the second voltage (GND) 410 as a base reference for the output 602 of FIG. 6.

It is understood that the inclusion of the first power amplifier 702, the second power amplifier 710, and the third power amplifier 718 is an example only and any number of the power amplifier 220, having a differential output can be magnetically coupled to the summing inductor 726. It is further understood that the magnetic coupling of any of the first coupling inductor 708, the second coupling inductor 716, and the third coupling inductor 724 can be added together through the summing inductor 726. The output 602 can be combined through the summing inductor 726 and coupled to the matching network 416 for transmission through the antenna 224. The combination of any of the first coupling inductor 708, the second coupling inductor 716, or the third coupling inductor 724 and the summing inductor 726 can form a balun 728

Figure 8:
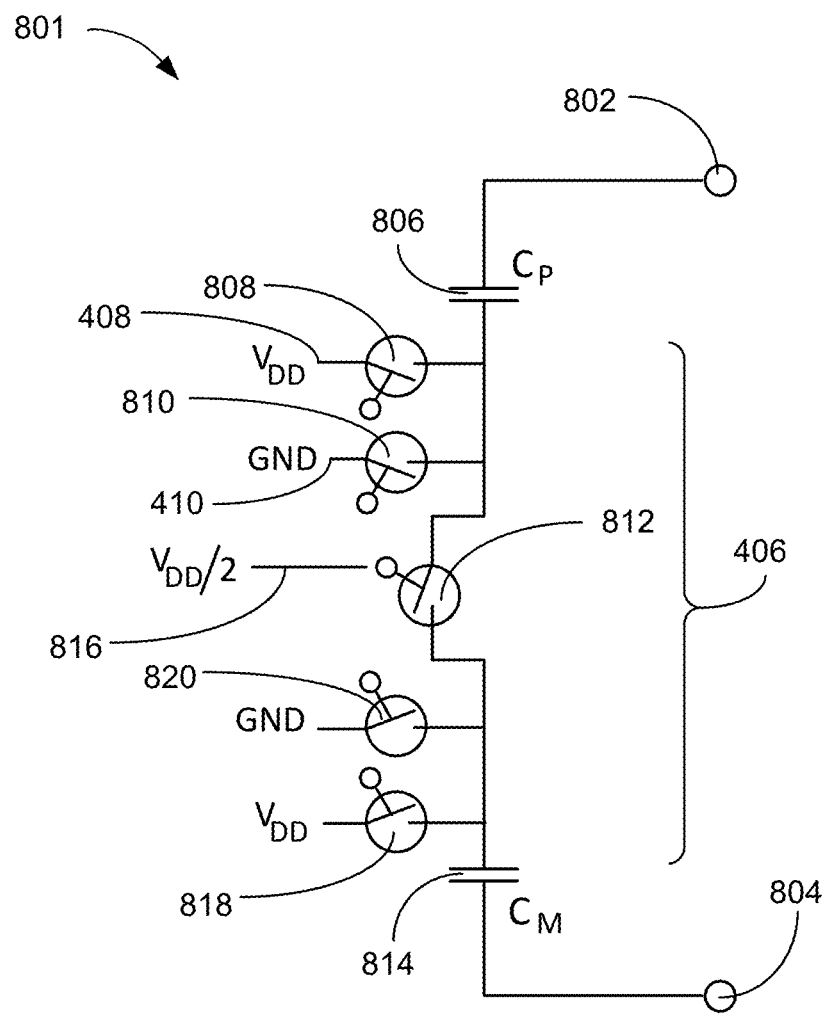
FIG. 8 is a schematic diagram of a unit capacitor of the power amplifier of FIG. 2.

Referring now to FIG. 8, therein is shown a schematic diagram of a unit capacitor 801 of the power amplifier 220 of FIG. 2 which is a preferred embodiment of the invention. The schematic diagram of the unit capacitor 801 depicts a positive differential output 802 and a negative differential output 804.

The positive differential output 802 can be electrically coupled to a positive switching capacitor 806. The other side of the positive switching capacitor 806 can be electrically coupled to a positive first voltage switch 808, a positive second voltage switch 810, and a shared intermediate voltage switch 812. The positive first voltage switch 808 can be a metal oxide semiconductor field effect transistor (MOSFET) configured to couple the first voltage 408 when the positive switching capacitor 806 is charged to the first voltage 408.

The positive second voltage switch 810 can be a metal oxide semiconductor field effect transistor (MOSFET) configured to couple the second voltage 410 when the positive switching capacitor 806 is discharged to the second voltage 410. The shared intermediate voltage switch 812 can be a metal oxide semiconductor field effect transistor (MOSFET) configured to couple a negative switching capacitor 814 to the positive switching capacitor 806 for recovering the charge by forming a virtual intermediate voltage 816.

The negative switching capacitor 814 can be electrically coupled to a negative first voltage switch 818, such as a metal oxide semiconductor field effect transistor (MOSFET), configured to couple the first voltage 408 to the negative switching capacitor 814. The negative switching capacitor 814 can also be electrically coupled to a negative second voltage switch 820, such as a metal oxide semiconductor field effect transistor (MOSFET), configured to couple the second voltage 410 to the negative switching capacitor 814.

During the operation of the unit capacitor 801, the positive switching capacitor 806 and the negative switching capacitor 814 can be charged to opposite states. By way of an example if the positive switching capacitor 806 is discharged to the second voltage 410, the positive switching capacitor 806 will be charged to the first voltage 408. When the states change, the shared intermediate voltage switch 812 can be activated in order to equalize the levels of the positive switching capacitor 806 and the negative switching capacitor 814. The charge will flow from the negative switching capacitor 814 to the positive switching capacitor 806 until they both are stable at the virtual intermediate voltage 816. This operation recovers the energy required to pre-charge the positive switching capacitor 806, up to the virtual intermediate voltage 816, from the negative switching capacitor 814. The virtual intermediate voltage 816 is truly virtual because it only exists in the middle of the shared intermediate voltage switch 812.

Once the virtual intermediate voltage 816 has stabilized, the shared intermediate voltage switch 812 is opened and the positive first voltage switch 808 can be activated to complete the charge of the positive switching capacitor 806 to the first voltage 408. At the same time, the negative second voltage switch 820 can be activated in order to complete the discharge of the negative switching capacitor 814 to the second voltage 410.

It has been discovered that the unit capacitor 801 can reduce the power loss due to capacitor switching to one fourth of what was possible with previous switched-capacitor power amplifiers. The application of the shared intermediate voltage switch 812 can perform a pre-charge and a pre-discharge at the same time while recovering the energy that would otherwise have to be wasted. The delivery of the virtual intermediate voltage 816 through the shared intermediate voltage switch 812 is a reciprocating process between the positive switching capacitor 806 and the negative switching capacitor 814 that does not require implementation of the intermediate power supply for the intermediate voltage 412 of FIG. 4. The embodiment of the present invention can be integrated into a radio frequency integrated circuit utilizing complementary metal oxide semiconductor (CMOS) technology.

Figure 9:
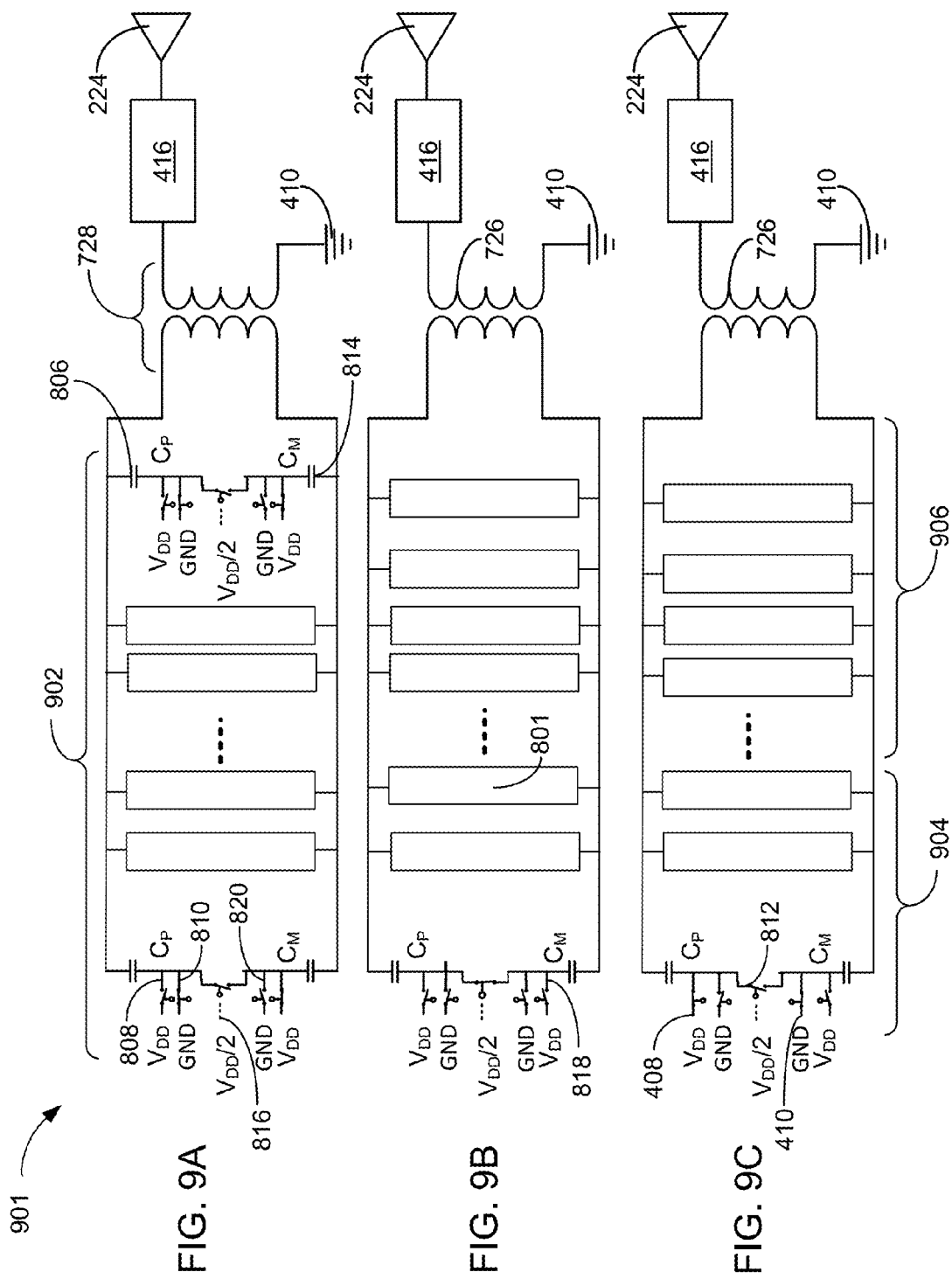
FIGS. 9A, 9B, and 9C is a schematic diagram of a switched capacitor array of the power amplifier of FIG. 2 in a transition from a first state, to an intermediate state, and a second state.

Referring now to FIGS. 9A, 9B, and 9C, therein is shown a schematic diagram of a switched capacitor array 902 of the power amplifier 220 of FIG. 2 in a transition 901 from a first state, to an intermediate state, and a second state. The schematic diagram of the switched capacitor array 902 of the power amplifier 220, in FIG. 9A, depicts the switched capacitor array 902 including N of the unit capacitor 801 in a first state. It is understood that N is an integer greater than one and can be any number, though a typical system could include 64, 128, 256, 512, or 1024, it is not necessary to have N be a power of 2. Some of the unit capacitors 801 in the switched capacitor array 902 are shown in detail in order to aid in understanding the transition process.

By way of an example, the initial state of all of the N instances of the unit capacitor 801 in the switched capacitor array 902 are the same. The positive first voltage switch 808 is open, the positive second voltage switch 810 is closed. The shared intermediate voltage switch 812 is open leaving the internal path of the unit capacitor 801 in an isolated state. The negative first voltage switch 818 is closed and the negative second voltage switch 820 is open. The first state as shown in FIG. 9A corresponds to the first phase 608 of FIG. 6.

It is understood that the first state could include a different initial state of the unit capacitor 801 in the switched capacitor array 902. Having all N of the unit capacitor 801 in the switched capacitor array 902 being configured in the same switch setting is not a requirement of the invention, just a way to clarify the description of the transition 901.

As shown in FIG. 9B, a first portion 904 of n of the unit capacitors 801 in the switched capacitor array 902 can be switched to the intermediate state of the transition 901. In this transition, only the first portion 904 of the unit capacitors 801 is switched and a second portion 906 of N-n of the unit capacitors 801 remains in the initial state. The first portion 904 can represent any number of the unit capacitors 801 in the switched capacitor array 902 including all of the unit capacitors 801 without limiting the invention.

The intermediate state of the transition 901 can have the first portion 904 of n of the unit capacitor 801 with the positive first voltage switch 808 is open, the positive second voltage switch 810 is open. The shared intermediate voltage switch 812 is closed providing the internal path of the unit capacitor 801 in the intermediate state. The negative first voltage switch 818 is open and the negative second voltage switch 820 is open. The intermediate state as shown in FIG. 9B corresponds to the second phase 610 of FIG. 6 and the fourth phase 606 of FIG. 6.

It is understood that the timing and order of the transition 901 of the positive second voltage switch 810, the negative first voltage switch 818, and the shared intermediate voltage switch 812 can be critical. Both the positive second voltage switch 810 and the negative first voltage switch 818 must be opened prior to the closing of the shared intermediate voltage switch 812.

In the intermediate state, the shared intermediate voltage switch 812 can couple the positive switching capacitor 806 to the negative switching capacitor 814. The coupling of the positive switching capacitor 806 to the negative switching capacitor 814 allows an equal sharing of the charge stored in the positive switching capacitor 806 and the negative switching capacitor 814. Since the resistance of the shared intermediate voltage switch 812 is as low as possible, the time constant is very short and can approach the maximum speed of the positive switching capacitor 806 and the negative switching capacitor 814. The transfer of charge between the positive switching capacitor 806 and the negative switching capacitor 814 can provide a source of the virtual intermediate voltage 816. The charge will distribute evenly between the positive switching capacitor 806 and the negative switching capacitor 814 and stabilize with each having the virtual intermediate voltage 816 equal to $V_{DD}/2$ without drawing additional current from the system power supply.

As shown in FIG. 9C, the first portion 904 of n of the unit capacitors 801 in the switched capacitor array 902 can be switched to the second state of the transition 901. In this transition, only the first portion 904 of the unit capacitors 801 is switched and the second portion 906 of N-n of the unit capacitors 801 remains in the initial state.

For all of the unit capacitors 801 in the first portion 904, the positive first voltage switch 808 is closed, the positive second voltage switch 810 is open. The shared intermediate voltage switch 812 is open leaving the internal path of the unit capacitor 801 in an isolated state. The negative first voltage switch 818 is open and the negative second voltage switch 820 is closed. The second state as shown in FIG. 9C corresponds to the third phase 612 of FIG. 6.

In the transition from the second state to the third state, the shared intermediate voltage switch 812 must be opened prior to closing the positive first voltage switch 808 and the negative second voltage switch 820. This will allow charge from the source of the first voltage ($V_{DD}$) 408 to move to the positive switching capacitor ($C_P$) 806 and charge from the source of the second voltage (GND) 410 to move to the negative switching capacitor ($C_M$) 814.

It is understood that the switched capacitor array 902 in FIGS. 9A, 9B, and 9C are all the same grouping of the unit capacitors 801 as controlled at different times as described in the exemplary timing diagram 601 of FIG. 6. The balun 728, the matching network 416, and the antenna 224 provide the wireless transfer mechanism, of the first device 102 of FIG. 1, driven by the switched capacitor array 902.

It has been discovered that the utilization of the shared intermediate voltage switch 812 can transfer charge between the positive switching capacitor ($C_P$) 806 and the negative switching capacitor ($C_M$) 814 without requiring additional energy from the source of the first voltage ($V_{DD}$) 408 or the source of the second voltage (GND) 410. The reduction in energy required for switching the switched capacitor array 902 can improve the transmission capabilities of the first device 102 without adding requirements for additional battery support.

Figure 10:
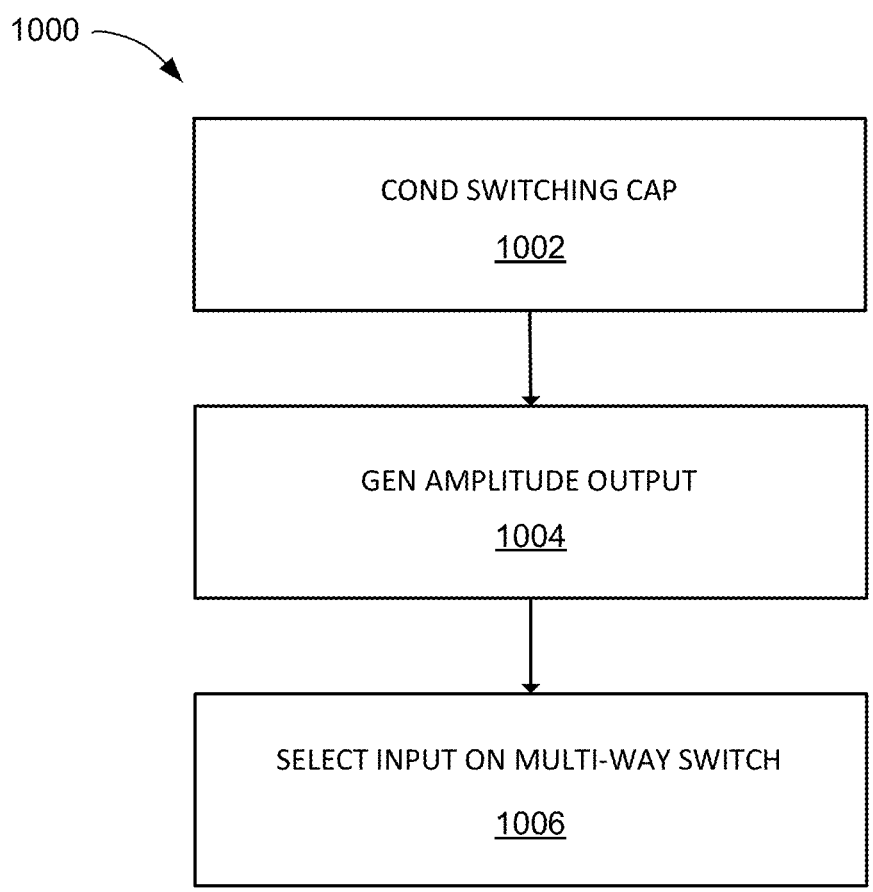
FIG. 10 is a flow chart of a method of operation of a wireless communication system in an embodiment of the present invention.

Referring now to FIG. 10, therein is shown a method 1000 of operation of a wireless communication system 100 in an embodiment of the present invention. The method 1000 includes: conditioning a switching capacitor by an intermediate voltage input from a multi-way switch in a block 1002; generating an amplitude output including controlling the multi-way switch in a block 1004; and selecting a first voltage input, a second voltage input, or an intermediate voltage input on the multi-way switch for reducing a power loss of the switching capacitor in a block 1006.

It has been discovered that the unit capacitor can reduce the power loss due to capacitor switching to one fourth of what was possible with previous switched-capacitor power amplifiers. The application of the shared intermediate voltage switch can perform a pre-charge and a pre-discharge at the same time while recovering the energy that would otherwise have to be wasted. The delivery of the virtual intermediate voltage through the shared intermediate voltage switch is a reciprocating process between the positive switching capacitor and the negative switching capacitor that does not require implementation of the power supply for the intermediate voltage.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A wireless communication system comprising:
   a switching capacitor;
   a multi-way switch coupled to the switching capacitor, the multi-way switch including at least a first voltage input port, a second voltage input port, and an intermediate voltage input port,
   a second capacitor coupled to the multi-way switch and further coupled to the switching capacitor across the multi-way switch; and
   a CORDIC processor, coupled to the multi-way switch, configured to select the first voltage input port, the second voltage input port, or the intermediate voltage input port.

2. The system as claimed in claim 1 further comprising a switched capacitor array formed of N of the switching capacitor coupled to N of the multi-way switch.

3. The system as claimed in claim 1 further comprising:
   a matching network coupled to the switching capacitor; and
   an antenna coupled to the matching network.

4. The system as claimed in claim 1 wherein the multi-way switch includes a shared intermediate voltage switch.

5. The system as claimed in claim 1 further comprising a first coupling inductor, coupled to the switching capacitor, configured to magnetically couple to a summing inductor.

6. The system as claimed in claim 1 further comprising:
   a positive switching capacitor;
   a shared intermediate voltage switch coupled to the positive switching capacitor;
   a negative switching capacitor coupled to the shared intermediate voltage switch; and
   a virtual intermediate voltage coupled between the positive switching capacitor and the negative switching capacitor through the shared intermediate voltage switch.

7. The system as claimed in claim 6 further comprising:
   a switched capacitor array formed of N of the switching capacitor coupled to N of the multi-way switch; and
   wherein:
   the N of the multi-way switch includes N of the shared intermediate voltage switch.

8. The system as claimed in claim 6 further comprising:
   a matching network coupled to the switching capacitor; and
   an antenna coupled to the matching network including 90% of an output power delivered by the switching capacitor.

9. The system as claimed in claim 6 wherein the shared intermediate voltage switch activated to pre-charge or pre-discharge the positive switching capacitor and the negative switching capacitor.

10. The system as claimed in claim 6 further comprising a first coupling inductor, coupled to the switching capacitor, configured to magnetically couple to a summing inductor including a leading waveform and a trailing waveform offset 36° by a fourth phase coupled to the summing inductor.

11. A wireless communication system comprising:
    a switching capacitor configured as a positive switching capacitor;
    a multi-way switch, including at least a first voltage input port, a second voltage input port, and an intermediate voltage input port, coupled to the switching capacitor includes a shared intermediate voltage switch coupled to the positive switching capacitor;
    a negative switching capacitor coupled to the shared intermediate voltage switch; and
    a CORDIC processor, coupled to the multi-way switch, configured to select the first voltage input port, the second voltage input port, or the intermediate voltage input port includes a virtual intermediate voltage coupled between the positive switching capacitor and the negative switching capacitor through the shared intermediate voltage switch.

12. The system as claimed in claim 11 further comprising:
    a switched capacitor array formed of N of the switching capacitor coupled to N of the multi-way switch; and
    wherein:
    the N of the multi-way switch includes N of the shared intermediate voltage switch.

13. The system as claimed in claim 11 further comprising:
    a matching network coupled to the switching capacitor; and
    an antenna coupled to the matching network including 90% of an output power delivered by the switching capacitor.

14. The system as claimed in claim 11 wherein the shared intermediate voltage switch activated to pre-charge or pre-discharge the positive switching capacitor and the negative switching capacitor.

15. The system as claimed in claim 11 further comprising a first coupling inductor, coupled to the switching capacitor, configured to magnetically couple to a summing inductor including leading waveform and a trailing waveform offset 36° by a fourth phase coupled to the summing inductor.

16. A method of operation of a wireless communication system comprising:
    conditioning a switching capacitor by an intermediate voltage input from a multi-way switch;
    generating an amplitude output including controlling the multi-way switch; and
    selecting an intermediate voltage input of the multi-way switch during a transition between switching from a first voltage input and a second voltage input, the intermediate voltage input electrically coupling the switching capacitor with a second capacitor for reducing a power loss of the switching capacitor.

17. The method as claimed in claim 16 further comprising accessing a switched capacitor array by controlling N of the multi-way switch coupled to N of the switching capacitor.

18. The method as claimed in claim 16 further comprising driving an antenna including magnetically coupling the switching capacitor through a matching network.

19. The method as claimed in claim 16 wherein conditioning a switching capacitor by an intermediate voltage input from a multi-way switch includes selecting a shared intermediate voltage switch.

20. The method as claimed in claim 16 further comprising driving a first coupling inductor by the switching capacitor including magnetically coupling the switching capacitor through a summing inductor.

* * * * *